United States Patent [19]
Koizumi et al.

[11] Patent Number: 5,003,264
[45] Date of Patent: Mar. 26, 1991

[54] MR IMAGING METHOD AND APPARATUS

[75] Inventors: Hideaki Koizumi; Toshiaki Aritomi; Shinji Yamamoto, all of Katsuta; Yutaka Takuma, Tokyo, all of Japan

[73] Assignee: Hitachi, Ltd., Tokyo, Japan

[21] Appl. No.: 490,457

[22] Filed: Mar. 8, 1990

[30] Foreign Application Priority Data

Mar. 17, 1989 [JP] Japan ............................ 1-67277

[51] Int. Cl.$^5$ .............................................. G01R 33/44
[52] U.S. Cl. ........................................ 324/309; 324/312
[58] Field of Search ................. 324/309, 312, 318; 128/653 A, 653 SC; 364/413.13, 413.22

[56] References Cited

U.S. PATENT DOCUMENTS 4,472,683 9/1984 Sekihara et al. ................. 324/309
4,770,182 9/1988 Damadian et al. ................ 324/309
4,853,636 8/1989 Yamamoto et al. ............... 324/312
4,871,966 10/1989 Smith et al. ....................... 324/309

FOREIGN PATENT DOCUMENTS 286452 12/1987 Japan .

Primary Examiner—Michael J. Tokar
Assistant Examiner—Kevin D. O'Shea
Attorney, Agent, or Firm—Antonelli, Terry, Stout & Kraus

[57] ABSTRACT

MR imaging method and apparatus are disclosed in which one image is displayed such that a high-resolution image of a partial region obtained by measurement according to a low-speed sequence is inserted into a low-resolution whole image obtained by measurement according to a high-speed sequence.

10 Claims, 5 Drawing Sheets

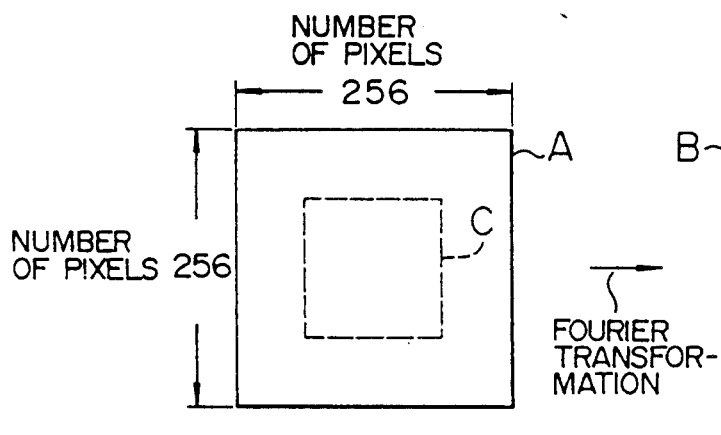
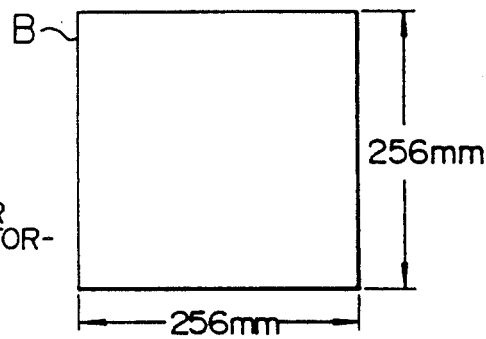
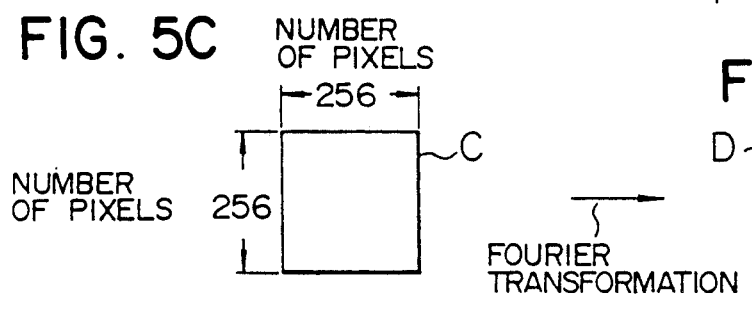
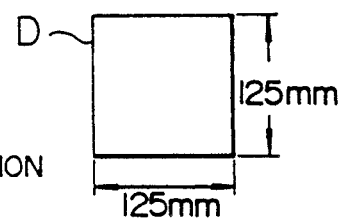
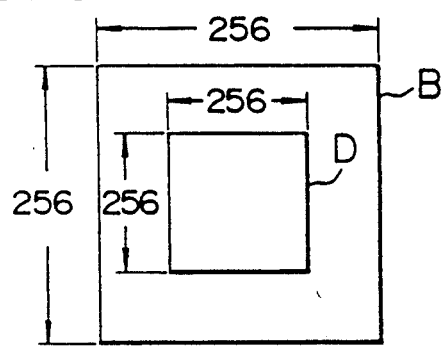

MR IMAGING METHOD AND APPARATUS

BACKGROUND OF THE INVENTION

The present invention relates to MR (magnetic resonance) imaging method and apparatus for an image diagnosis system which utilizes an NMR (nuclear magnetic resonance) phenomenon.

In this kind of MR imaging apparatus, an image of the human head by way of example is generally displayed representing a field of view of 250 mm×250 mm by 256×256 pixels. In recent years, however, it has been desired to display an image with a much higher definition. For example, the following techniques (1) and (2) are known:

(1) a part of a field of view which is a so-called region of interest is displayed over the whole of a display screen; and (2) the whole of a field of view is taken in or picked up with 512×512 pixels and an image is displayed with the same number of pixels.

However, in the technique (1), since the size of one pixel is only enlarged, the resolution is unchanged or not improved notwithstanding that the region of interest is displayed in an enlarged form. In the case of the technique (2), since the number of pixels is doubled, a doubled time is required for taking in or acquiring data. In general, the S/N ratio and the area of a pixel have the relation of $$\sqrt{\text{area of pixel}} \propto S/N,$$

and the S/N ratio and the number of times of data accumulation or integration for averaging of data performed for improvement in S/N ratio have the relation of $$\sqrt{\text{number of times of data accumulation}} \propto S/N.$$

Accordingly, in the technique (2), since the area of a pixel decreases to quarter, the S/N ratio decreases or deteriorates to half. Accordingly, in order to improve the S/N ratio to the same order as that in the case where the number of pixels is 256×256, the S/N ratio must be doubled. This means that the number of times of data accumulation should be performed four times. As a result, a data acquisition time required has an increase by eight times.

SUMMARY OF THE INVENTION

An object of the present invention is to provide MR imaging method and apparatus in which only a region of interest among the whole image is displayed as a high-resolution image having a high definition.

According to the present invention, an MR image capable of providing information which is truly necessary for diagnosis can be acquired in a short time. In the field of MR imaging, if data is collected taking a long time, the S/N ratio is improved so that an image having a better quality is obtained. In the present invention, the whole image is formed on the basis of a short-time sequence in which the amount of information per unit time is reduced. Only a region of interest among the whole image is imaged on the basis of a long-time sequence in which the amount of information obtained per unit time is large. A final image is displayed as one continuous image in which a part of the whole image having a low definition has a high definition.

As is apparent from the above, the present invention makes it possible to display a image of the region of interest with high definition under the condition that a time required until acquisition of a final image is substantially the same as the time required in the conventional MR imaging apparatus.

BRIEF DESCRIPTION OF THE DRAWINGS

FIGS. 5A-5B are diagrams showing example of image construction according to the present invention.

DESCRIPTION OF THE PREFERRED EMBODIMENTS

An embodiment of an MR imaging apparatus according to the present invention will now be described.

Figure 1:
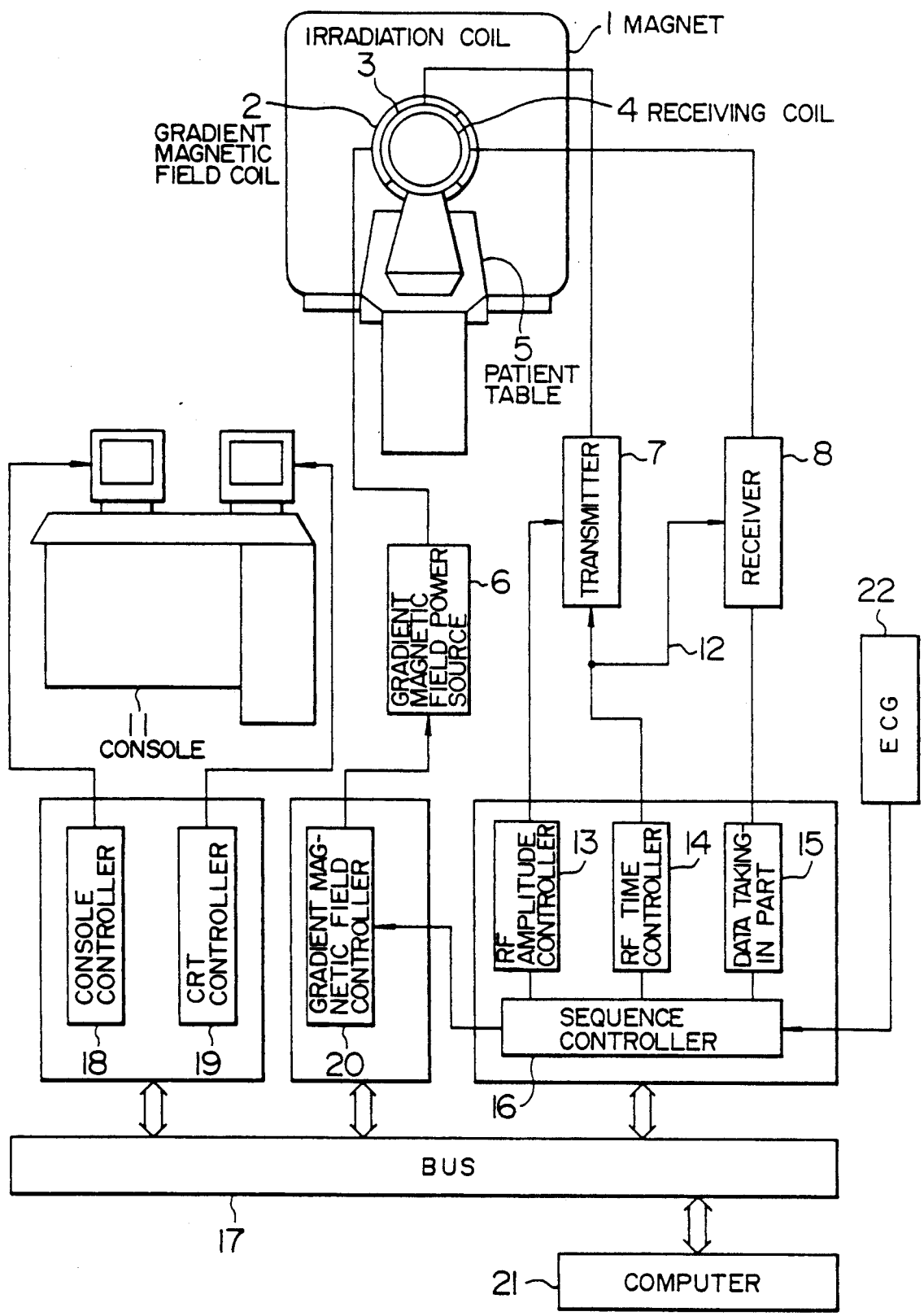
FIG. 1 is a schematic view showing the construction of an MR imaging apparatus according to the present invention.

First, the outline of the MR imaging apparatus will be shown by virtue of FIG. 1. In the figure, a magnet 1 forms a main part of the present system or apparatus. The magnet 1 may be one of three types, that is, a superconducting type, a normal conducting type and a permanent magnet type. In the present embodiment, a superconducting type of magnet is shown. The superconducting type of magnet 1 provides the magnetic field intensity of 0.5 T, the bore diameter of 1 m and the magnetic field homogeneity of 5 rnm/30 cm ds v (sphere).

An object or patient to be examined lies on a patient table 5 and is fed into a central portion of the magnet 1. Gradient magnetic fields for acquiring spacial position information are superimposed on a gradient magnetic field coil 2. A high frequency (RF) for causing the generation of a NMR (nuclear magnetic resonance) phenomenon is supplied from a transmitter 7 to an irradiation coil 3. An NMR signal generated from the patient or the object to be examined is detected by a receiving coil 4 and is fed to a receiver 8. In the NMR phenomenon, phase information of the NMR signal is also important. Therefore, the transmitter 7 and the receiver 8 are accurately synchronized with each other in a phase relation therebetween by virtue of a receiver gate signal 12 from an RF time controller 14.

A gradient magnetic field power source 6 is constructed by a three-channel power source so as to independently generate gradient magnetic fields in three axis (X, Y and Z) directions of a three-dimensional orthogonal coordinate system. Since the gradient magnetic field at the gradient magnetic field coil 2 is applied in a pulse form by the gradient magnetic field power source 6, a high-speed response is required. The generation of the gradient magnetic field pulse is controlled by a gradient magnetic field controller 20.

The manipulation of the system is conducted by use of a console 11. The console 11 is provided with various keys as well as two CRT's including one which is used to interactively set various parameters or to make the operation of the whole of the system through a console controller 18 and the other which is used to display an obtained image through a CRT controller 19 and in which the number of pixels in the image display system is, for example, 512×512.

The control for the whole of the system and a high-speed operation for image construction are performed by a computer 21. Communication between the computer 21 and various controllers is made through a bus 17. The control for various pulse sequences is made through a sequence controller 16. A main sequence controlled by the sequence controller 16 includes the combination of the RF pulse and the gradient magnetic field pulse. Namely, the sequence controller 16 is inputted with the output of an electrocardiograph (ECG) 22 and supplies outputs to the transmitter 7 through an RF amplitude controller 13, to the receiver 8 through a data taking-in part 15 and to the gradient magnetic field controller 20.

Figure 2:
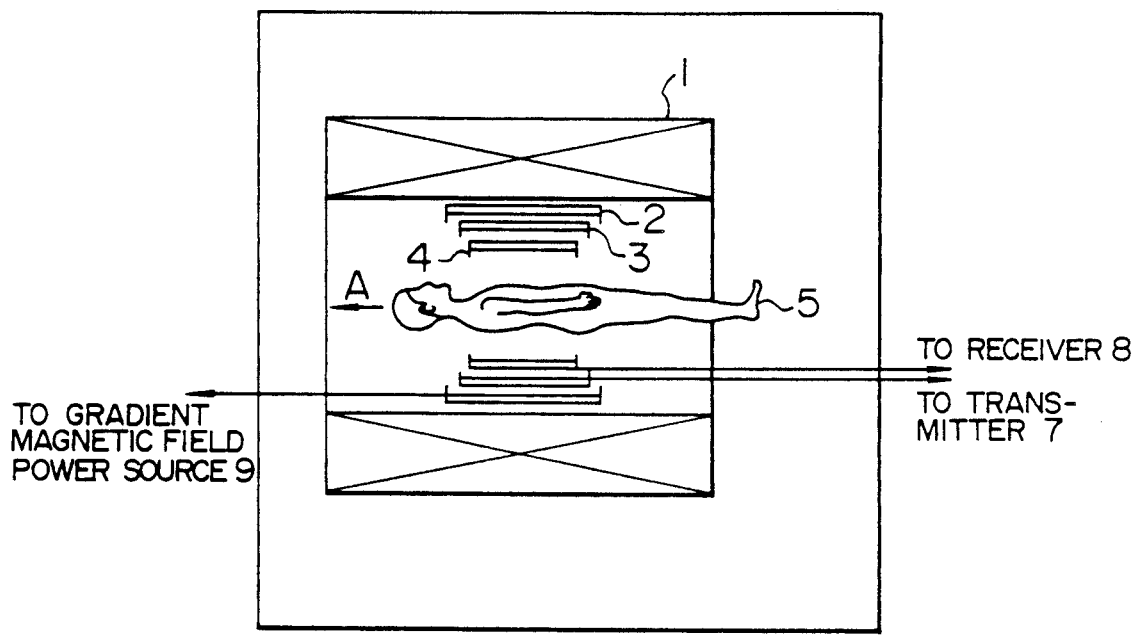
FIG. 2 is a systematic view showing a magnet portion of the MR imaging apparatus according to the present invention.

FIG. 2 shows a cross section of a measuring part in the magnet 1. The magnet 1 which is of a superconducting type, as mentioned above, is constructed by a static magnetic field coil 1 held at a liquid He temperature. Inside of the static magnetic coil 1 are successively disposed the gradient magnetic field coil 2, the irradiation coil 3 and the receiving coil 4. The direction of the static magnetic field is indicated by arrow A in FIG. 2. Usually, the Z axis is defined as the direction of the static magnetic field. It is necessary that gradient magnetic fields are quite independently applied in the X, Y and Z directions. For this purpose, three kinds of X, Y and Z coils are provided.

Figure 3:
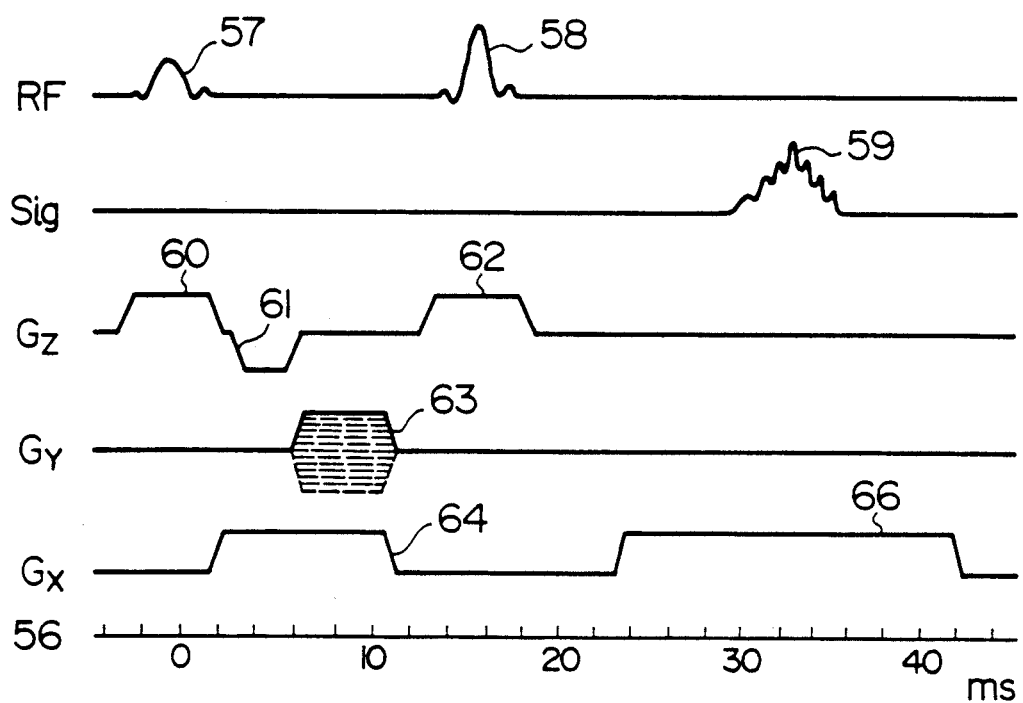
FIG. 3 is a chart showing a pulse sequence generally used in an MR imaging apparatus.

Next, the fundamental principle of a sequence generally carried out in the conventional MR imaging apparatus will be described by virtue of FIG. 3 prior to explanation of a sequence for obtaining a tomographic or cross-sectional image in the present embodiment. FIG. 3 shows a high frequency (RF) pulse RF representing a pulse waveform of a high RF power from the irradiation coil 3 with which the patient is irradiated, an MR (magnetic resonance) signal Sig which is an amplified version of an electro motive force inputted to the receiving coil 4, a gradient magnetic field $G_Z$ applied in the direction of the static magnetic field or the Z direction, a gradient magnetic field $G_Y$ for encoding the phase in the Y direction and a gradient magnetic field $G_X$ for making a one-to-one correspondence between the X coordinate and the frequency. The gradient magnetic field $G_X$ may be called a read-out gradient magnetic field since it is used to cause the generation of spin echoes. A temporal axis or time base 56 clarifies a temporal relation between the above-mentioned pulse sequences.

More detailed explanation of the functions of the various pulses mentioned above will now be made and the principle of an image construction method called a two-dimensional Fourier method will be described.

In the example shown in FIG. 3, a sinc function is used for the pulse waveform of the high frequency RF. The Fourier transformation of a sinc function results in a rectangular waveform. Namely, when a sinc function in a temporal space is Fourier-transformed, it results in a rectangular waveform in a frequency space which has only frequencies within a certain limited region. In FIG. 3, a gradient magnetic field pulse 60 of the gradient magnetic field $G_Z$ is applied simultaneously with a 90° pulse 57 in the high frequency RF which causes nuclear spins to tilt by 90°. Only a specified cross-sectional plane or slice in the Z direction is selectively excited since the resonance condition in the NMR phenomenon is represented by $$\omega_0 = \gamma[H_0 + H_G(Z)] \quad (1)$$

where $\omega_0$ is the angular velocity at a resonance point, $\gamma$ the gyromagnetic ratio, $H_0$ the flux density of the static magnetic field, and $H_G(Z)$ the flux density of the gradient magnetic field at a position Z.

In the usual NMR imaging, a frequency for selective irradiation is set for a range of the thickness of a slice from 1 mm to 20 mm. A 180° pulse 58 is applied after the application of the 90° pulse 57, thereby obtaining a spin echo signal 59 in the magnetic resonance signal Sig. (In the two-dimensional Fourier method at the early stage, the spin echoes are generated by a gradient magnetic field and hence no 180° pulse is used.)

In the spin echo technique, a phase rapidly dispersing at a lateral relaxation time due to an inhomogeneous magnetic field is well matched again after a predetermined time. The gradient magnetic field is one kind of inhomogeneous magnetic field. Accordingly, in order to obtain a signal of the same phase, it is necessary to invert the gradient magnetic field as in a gradient magnetic field echo method or to apply a 180° pulse simultaneously with the gradient magnetic field as in a spin echo method. The gradient field applied has finite rise and fall times. Actually, a time of the order of 1 ms is required. The phase is put out of order in this transient period of time. In order to compensate for this, a compensation pulse 61 is applied after the gradient magnetic field $G_Z$ pulse 60 so that the phase disturbances at the rise and fall times are cancelled from each other, thereby providing a situation resembling the case where a complete rectangular wave is applied.

Explanation will now be made of phase encoding.

According to the fundamental characteristics of behaviors of nuclear spins in the NMR phenomenon, the frequency and the phase are parameters independent of each other and the correspondence to the spacial coordinates in the Y direction is given to an obtained resonance signal by encoding the phase.

A gradient magnetic field for encoding the phase is the gradient magnetic field $G_Y$. Since the amount of phase encode is determined by the integral value of phase encoding gradient magnetic field pulse, it is sufficient to change the amplitude or width of the pulse. In the example shown in FIG. 3, the amplitude is changed as shown by a phase encoding pulse 63.

The gradient magnetic field $G_X$ is a gradient magnetic field applied in the X direction. When a gradient magnetic field 64 in the X direction is applied to spins which are excited by the 90° pulse 57 to make a coherent precession, the rotation speed of the precession is linearly changed in the X direction. By applying a gradient magnetic field 66 in the X direction after the 180° pulse 58, it is possible to generate a spin echo signal 59. The separation of positions in the X direction is effected by a frequency filter. Since there is a linear relation between the X coordinate and the resonance frequency, it is possible to obtain signal intensities related to the X coordinates by Fourier-transforming the spin echo signal 59. By Fourier-transforming the spin echo signal 59 again in the phase encoding direction or along the Y axis, it is possible to obtain signal intensities related to the Y coordinates. Thus, the distribution of signal intensities in an X-Y plane is obtained. The signal intensity distribution is displayed on a CRT to obtain a tomographic image.

A pulse sequence in the present embodiment for obtaining a tomographic image will now be explained by virtue of FIGS. 4A and 4B on the premise of the above-described fundamental principle of the pulse sequence in the MR imaging apparatus.

Figure 4A:
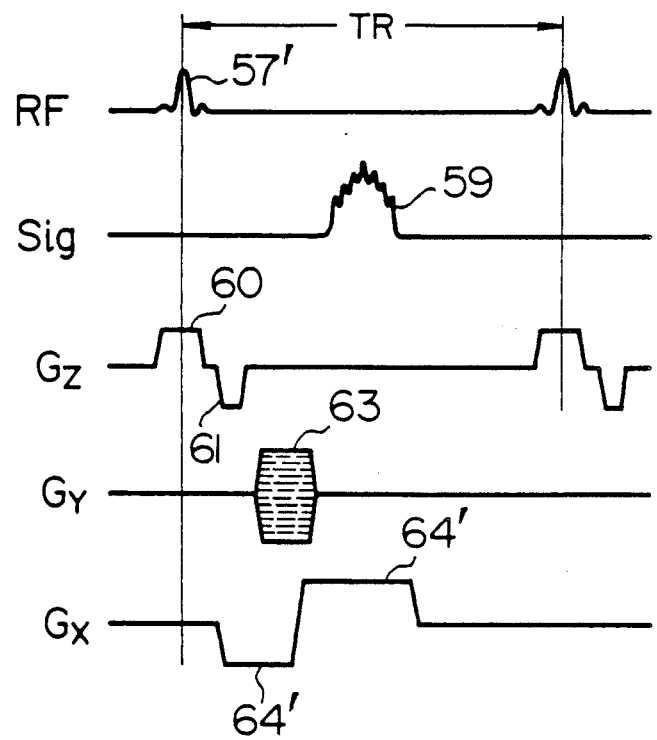
FIGS. 4A and 4B are charts showing pulse sequences used in the present invention.

FIG. 4A shows a sequence for obtaining an image at a high speed. FIG. 4A is shown with a correspondence to FIG. 3. FIG. 4A is different from FIG. 3 in that no 180° pulse (58 in FIG. 3) is used and there-instead a gradient magnetic field pulse 64' is inverted in accordance with the gradient magnetic field echo method to obtain a spin echo signal 59. Further, in order to improve the sensitivity in a rapid repetition condition, an $\alpha$ degree pulse 57' causing nuclear spins to tilt by $\alpha$ degree smaller than 90° is used in place of the 90° pulse (57 in FIG. 3). For example, $\alpha$ is 15° to 60°. Since the RF pulse providing the smaller flip angle is thus used, the longitudinal relaxation time is shortened, thereby making it possible to shorten the repetition time TR. In the sequence shown in FIG. 4A, when the repetition time TR is selected to be 30 ms, 256×256 sampling points can be acquired in about 7 seconds.

Figure 4B:
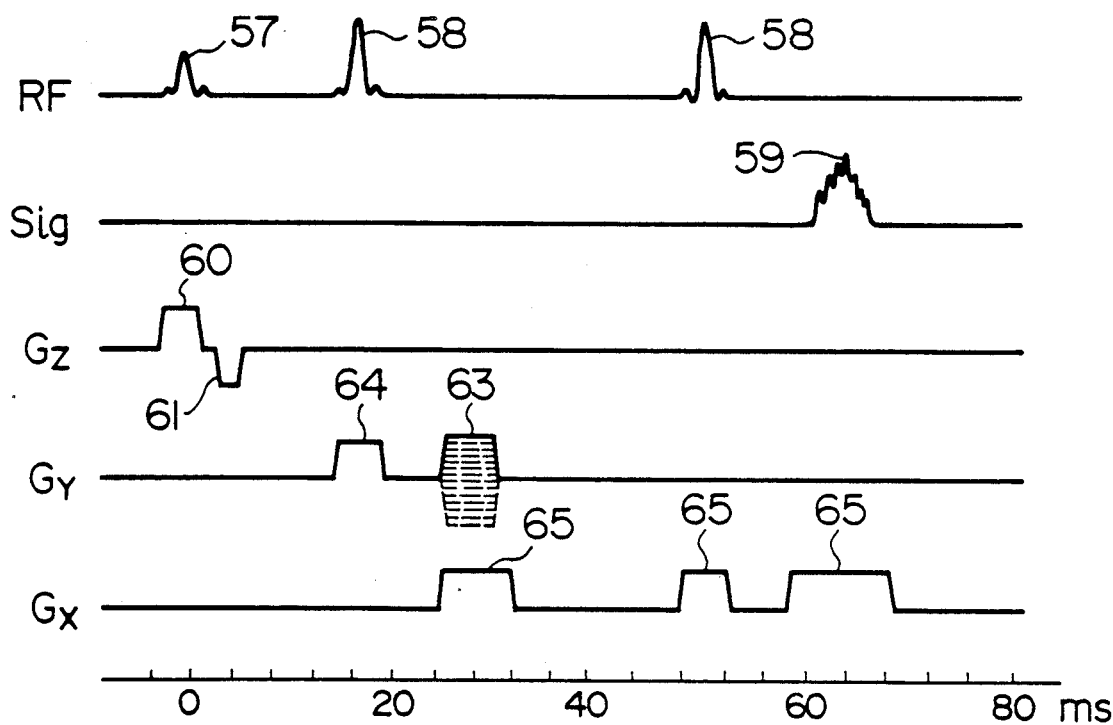

FIG. 4B shows a sequence for performing sampling from a region of interest. FIG. 4B is shown with a correspondence to FIG. 3. In FIG. 4B, two 180° pulses 58 are used. Gradient magnetic field $G_Z$, $G_Y$ and $G_X$ pulses 60, 64 and 65 are respectively applied simultaneously with a 90° pulse 57, the first 180° pulse 58 and the second 180° pulse 58 in order to effect the separation of positions in the Z, Y and X directions.

Each of the 90° pulse 57 and the 180° pulses 58 has a waveform of a sinc function. As a result, respective cross-sectional or slice planes in the X-, Y- and Z-axis directions are defined so that the region of interest is cut or extracted. Thereby, a partial region an image of which is to be displayed with a high definition is extracted.

Next, a relation between the sequence according to the present embodiment and an image obtained thereby will be explained by use of FIGS. 5A–5E.

By the sequence shown in FIG. 4A, a reconstruction image B is obtained from a sampling region A after Fourier transformation. For example, provided that a field of view when a tomographic image of the human head is formed is 250 mm×250 mm, the field of view is imaged with 256×256 pixels. The resolution in this case is about 1 mm. As has already been mentioned, a time required for imaging is about 7 seconds, provided that the repetition time TR is 30 ms.

On the other hand, according to the sequence shown in FIG. 4B, a reconstruction image D is obtained from a sampling region C after Fourier transformation. In this case, if a field of view for a region of interest is selected to be 125 mm×125 mm which is one fourth of the field of view employed in the sequence shown in FIG. 4A, the imaging is made with 256×256 pixels and hence the resolution attained is about 0.5 mm. Provided that the repetition time TR in the sequence shown in FIG. 4B is selected to be 2000 ms, a time required for imaging is about 8.5 minutes.

The high-definition image D obtained by the low-speed sequence is inserted into the low-definition image B obtained by the high-speed sequence, so that a single image having a high resolution for only the region of interest is obtained.

In the case where a part of the human head is imaged according to the usual sequence (or the sequence shown in FIG. 3), a remarkable aliasing false image may be produced due to the intrusion of a signal from the outside of the field of view. The alising false image is caused from the phenomenon that the signal from the outside of the field of view appears on an opposite region of the view field since it is axially symmetric in the phase encoding direction. Regarding the X direction, no problem arises since such a signal is cut off by a frequency filter. On the other hand, in the case of the sequence according to the present embodiment, a signal from the outside of the field of view does not generate since only a portion in the field of view is selectively excited. Accordingly, the present embodiment provides an effect that no alising false image is produced.

Figure 6:
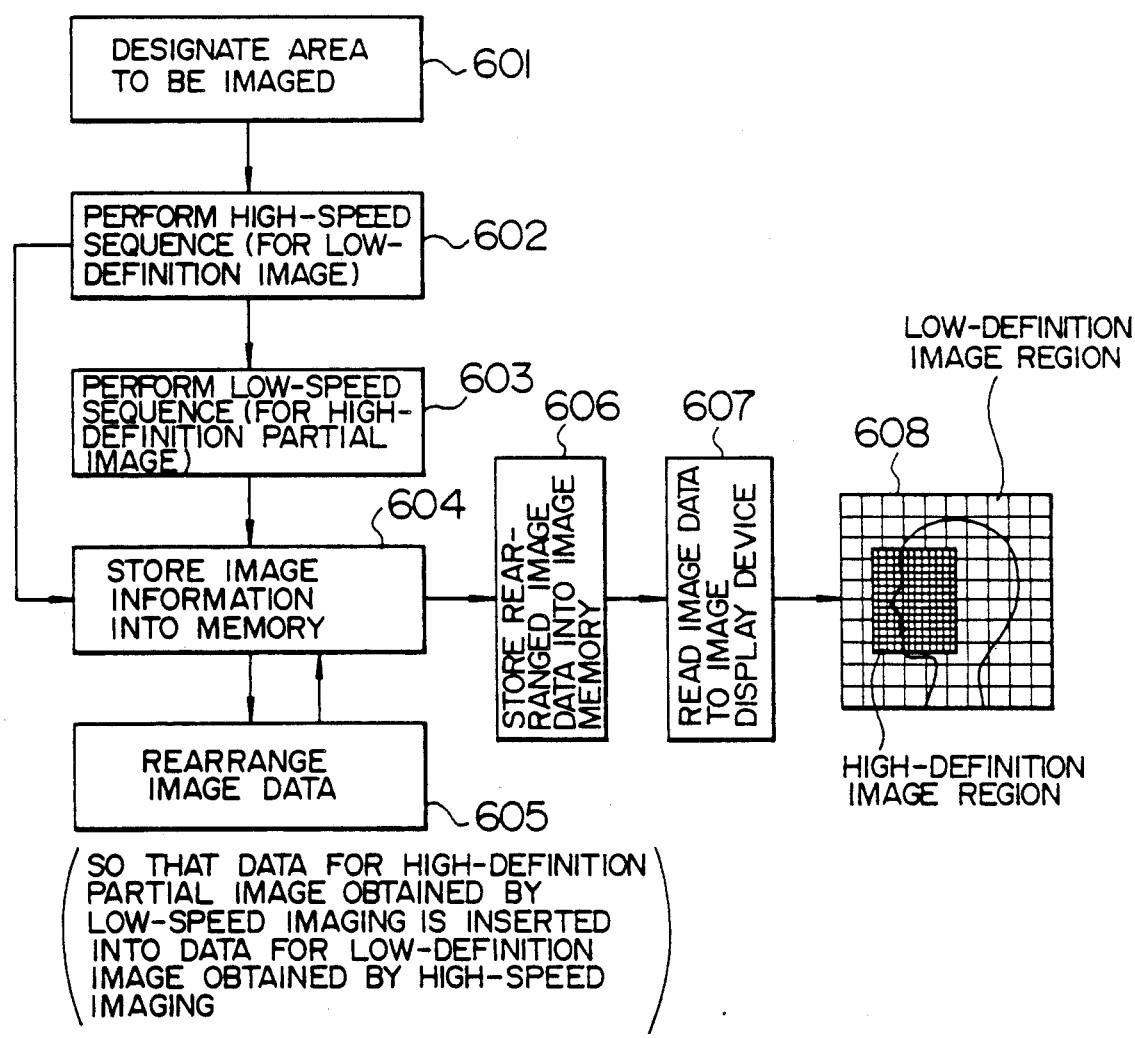
FIG. 6 is a flow chart in the case where images obtained on the basis of the pulse sequences shown in FIGS. 4A and 4B are displayed on a CRT.

Next, processings performed until images obtained on the basis of the sequences according to the present embodiment are displayed on a CRT will be explained by virtue of FIG. 6. Referring to FIG. 6, an area to be imaged is designated (step 601) and a high-speed sequence is thereafter performed for the designated area (step 602). This high-speed sequence corresponds to the sequence shown in FIG. 4A and is used for obtaining a low-definition image. Next, a low-speed sequence is performed for any region in the low-difinition image (step 603). This low-speed sequence corresponds to the sequence shown in FIG. 4B and is used for obtaining a high-definition image. Image information obtained by the high-speed sequence and image information obtained by the low-speed sequence are individually stored into a memory (step 604). The information stored in the memory is rearranged in accordance with an image data rearranging command (step 605) so that data for the partial image with high definition obtained by the high-speed imaging is inserted into data for the image with low definition obtained by the high-speed imaging. The thus rearranged information is stored into an image memory (step 606) and is displayed on a CRT through an image display device (steps 607 and 608).

In this manner, there is obtained an image in which a high-definition image region has a resolution of 0.5 mm and a surrounding image region has a resolution of 1 mm. Since the whole image is acquired in a short time on the basis of the high-speed pulse sequence, an increase of a time required for imaging is little.

Constructional features peculiar to the above-mentioned embodiment are as follows.

(1) A display system including a CRT or format camera is preliminarily implemented with a high definition. Therefore, the number of pixels of the display system is 512×512.

(2) An image of the whole is acquired with 256×256 pixels in a short time in accordance with a high-speed imaging method (for example, a low flip angle method).

(3) For a region of interest which is, for example, one-fourth of the whole, measurement data is taken in or acquired with 256×256 pixels. A measurement data acquisition time in this case is as the same that in the case where the whole is imaged with 256×256 pixels, but the S/N ratio decreases to half since the area of a pixel decreases to quarter. In order to prevent the decrease in S/N ratio, the number of times of accumulation or integration of acquired data requires an increase by four times and hence a measurement time has an increase by four times.

(4) When the region of interest is imaged, selective irradiation for the region of interest is performed upon data acquisition in order to eliminate an alising false image.

(5) A positional relation between the whole image and the region of interest is defined in terms of a relation between the intensity of a gradient magnetic field and the frequency of a resonance signal generated.

(6) Regarding the region of interest, since data is acquired with 256×256 pixels for a field of view which is one fourth of a field of view for the whole, the data is displayed with a pixel size corresponding to 512×512. Regarding the whole image, since data is acquired with 256×256 pixels, the data is displayed on the 512×512 display system through interpolation. Namely, on the display system is displayed a single whole image in which only the region of interest can be observed with a doubled resolution.

We claim:

1. A magnetic resonance imaging method comprising:
    (a) a step of applying an RF pulse and a gradient magnetic field to an object to be examined on the basis of a first pulse sequence to measure a first magnetic resonance signal;
    (b) a step of constructing a whole image over the whole of a display screen from said first magnetic resonance signal;
    (c) a step of selecting a portion of said whole image as a field of view for reimaging;
    (d) a step of selectively exciting said portion selected as the field of view for reimaging on the basis of a second pulse sequence to measure a second magnetic resonance signal;
    (e) a step of constructing from said second magnetic resonance signal a partial image of said selected portion with the size of said field of view for reimaging and with a resolution higher than a resolution of said whole image; and
    (f) a step of inserting said partial image into said whole image and displaying the resultant image.

2. A magnetic resonance imaging method according to claim 1, wherein the measurement step based on said first pulse sequence includes setting the period of generation of said RF pulse to a first value, and the measurement step based on said second pulse sequence includes setting the period of generation of said RF pulse to a second value which is greater than said first value.

3. A magnetic resonance imaging method according to claim 2, wherein in said first pulse sequence a flip angle of said RF pulse is set to a value smaller than 90° and in said second pulse sequence the flip angle of said RF pulse is set to 90°.

4. A magnetic resonance imaging method according to claim 3, wherein said first pulse sequence is performed on the basis of a gradient magnetic field echo method and said second pulse sequence is performed on the basis of a spin echo method.

5. A magnetic resonance imaging method according to claim 4, wherein said second pulse sequence includes as said RF pulse a 90° pulse and two 180° pulses and the measurement step based on said second pulse sequence includes applying gradient magnetic fields in X, Y and Z directions for said 90° and 180° pulses, respectively.

6. A magnetic resonance imaging apparatus comprising:
    (a) means for applying an RF pulse and a gradient magnetic field to an object to be examined on the basis of a first pulse sequence to measure a first magnetic resonance signal;
    (b) means for constructing a whole image over the whole of a display screen from said first magnetic resonance signal;
    (c) means for selecting a portion of said whole image as a field of view for reimaging;
    (d) means for selectively exciting said portion selected as the field of view for reimaging on the basis of a second pulse sequence to measure a second magnetic resonance signal;
    (e) means for constructing from said second magnetic resonance signal a partial image of said selected portion with the size of said field of view for reimaging and with a resolution higher than a resolution of said whole image; and
    (f) means for inserting said partial image into said whole image and displaying the resultant image.

7. A magnetic resonance imaging apparatus according to claim 6, wherein the measurement means based on said first pulse sequence includes means for setting the period of generation of said RF pulse to a first value, and the measurement means based on said second pulse sequence includes means for setting the period of generation of said RF pulse to a second value which is greater than said first value.

8. A magnetic resonance imaging apparatus according to claim 7, wherein the measurement means based on said first pulse sequence includes means for setting a flip angle of said RF pulse to a value smaller than 90° and the measurement means based on said second pulse sequence includes means for setting the flip angle of said RF pulse to 90°.

9. A magnetic resonance imaging apparatus according to claim 8, wherein the measurement means based on said first pulse sequence includes, as spin echo generation means, means for inverting said gradient magnetic field and the measurement means based on said second pulse sequence includes, as spin echo generation means, means for applying said RF pulse having a flip angle of 180°.

10. A magnetic resonance imaging apparatus according to claim 9, wherein the measurement means based on said second pulse sequence includes means for generating as said RF pulse a 90° pulse and two 180° pulses and applying gradient magnetic fields in X, Y and Z directions for said 90° and 180° pulses, respectively.

* * * * *